US008884604B2

(12) United States Patent
Zolnhofer

(10) Patent No.: US 8,884,604 B2
(45) Date of Patent: Nov. 11, 2014

(54) ADAPTIVE FEEDBACK CASCODE

(75) Inventor: Jens Bertolt Zolnhofer, Cambridge (GB)

(73) Assignee: Cambridge Silicon Radio Limited, Cambridge (GB)

( * ) Notice: Subject to any disclaimer, the term of this patent is extended or adjusted under 35 U.S.C. 154(b) by 1533 days.

(21) Appl. No.: 12/514,071

(22) PCT Filed: Nov. 6, 2007

(86) PCT No.: PCT/GB2007/004219
§ 371 (c)(1), (2), (4) Date: Jan. 15, 2010

(87) PCT Pub. No.: WO2008/059205
PCT Pub. Date: May 22, 2008

(65) Prior Publication Data

US 2010/0148870 A1 Jun. 17, 2010

(30) Foreign Application Priority Data

Nov. 13, 2006 (GB) .................................. 0622616.1

(51) Int. Cl.
*G05F 3/20* (2006.01)

(Continued)

(52) U.S. Cl.
CPC ...................................... *G05F 3/262* (2013.01)
USPC ............ 323/316; 323/280; 330/257; 327/358

(58) Field of Classification Search
USPC .......................... 323/312–317; 330/253, 257; 327/540–541
See application file for complete search history.

(56) References Cited

U.S. PATENT DOCUMENTS 5,525,927 A * 6/1996 Yung et al. .................... 327/543
5,835,994 A 11/1998 Adams (Continued)

FOREIGN PATENT DOCUMENTS

EP 1439444 A1 7/2004

(Continued)

OTHER PUBLICATIONS

International Search Report and Written Opinion mailed Feb. 4, 2008 in PCT/GB2007/004219.

(Continued)

*Primary Examiner* — Matthew Nguyen
*Assistant Examiner* — Henry Lee, III
(74) *Attorney, Agent, or Firm* — Vorys, Sater, Seymour and Pease LLP; Vincent M DeLuca

(57) ABSTRACT

A current mirror for generating a substantially identical current flow in two parallel current paths, each current path comprising a switching device and each switching device comprising first and second active terminals and a control terminal for controlling current flow between the first and second active terminals, the current mirror comprising a first switching device arranged such that its first active terminal is arranged to receive a first voltage, its second active terminal is arranged to receive a variable voltage that varies independently of the first voltage and its control terminal is arranged to receive a control voltage, a second switching device connected such that its first active terminal is arranged to receive the first voltage and its control terminal is arranged to receive the control voltage and a voltage control device connected to the second switching device such that an input of the voltage control device is connected to the second active terminal of the second switching device, the voltage control device being arranged to receive a control signal indicative of the variable voltage and to alter the voltage at its input terminal in dependence on the control signal such that the difference between the voltage across the active terminals of the second switching device and the voltage across the active terminals of the first switching device remains substantially constant.

16 Claims, 6 Drawing Sheets

(51) Int. Cl.

| | |
|---|---|
| ***G05F 3/26*** | (2006.01) |
| *H03F 3/45* | (2006.01) |
| *G05F 1/00* | (2006.01) |
| *G06F 7/44* | (2006.01) |

(56) References Cited

U.S. PATENT DOCUMENTS

| | | | | |
|---|---|---|---|---|
| 6,075,407 | A * | 6/2000 | Doyle | 327/539 |
| 6,300,833 | B1 * | 10/2001 | Vyne et al. | 330/257 |
| 6,522,111 | B2 * | 2/2003 | Zadeh et al. | 323/277 |
| 2004/0140845 | A1 * | 7/2004 | Eberlein | 327/541 |
| 2009/0085550 | A1 * | 4/2009 | Ide | 323/315 |

FOREIGN PATENT DOCUMENTS

| | | | |
|---|---|---|---|
| JP | 283907/1991 | A | 12/1991 |
| JP | 2003177289 | A | 6/2003 |
| JP | 200411057 | A | 4/2004 |
| JP | 2004342676 | A | 12/2004 |

OTHER PUBLICATIONS

Office Action dated Nov. 15, 2011 in related Japanese application.

Office Action issued for JP 2009-535788 possibly on Nov. 17, 2010.

* cited by examiner

FIG. 1 -- Prior Art --
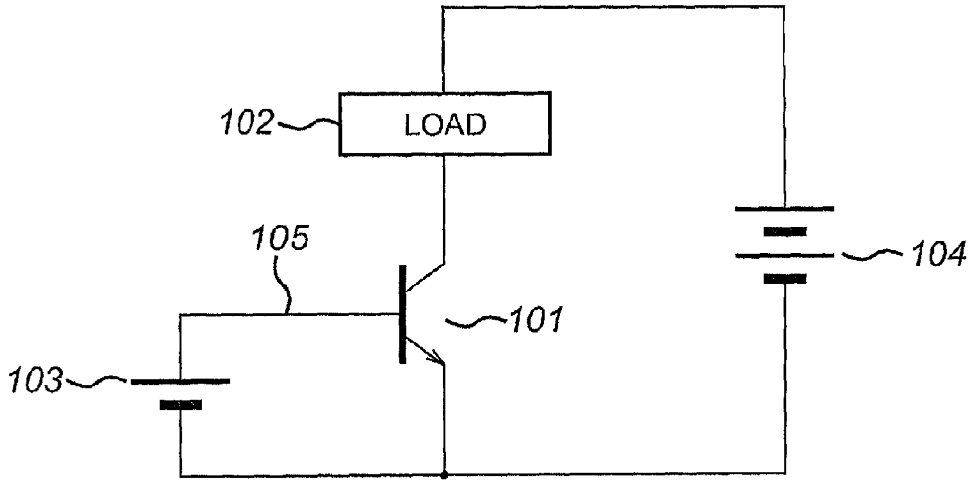
FIG. 2 -- Prior Art --
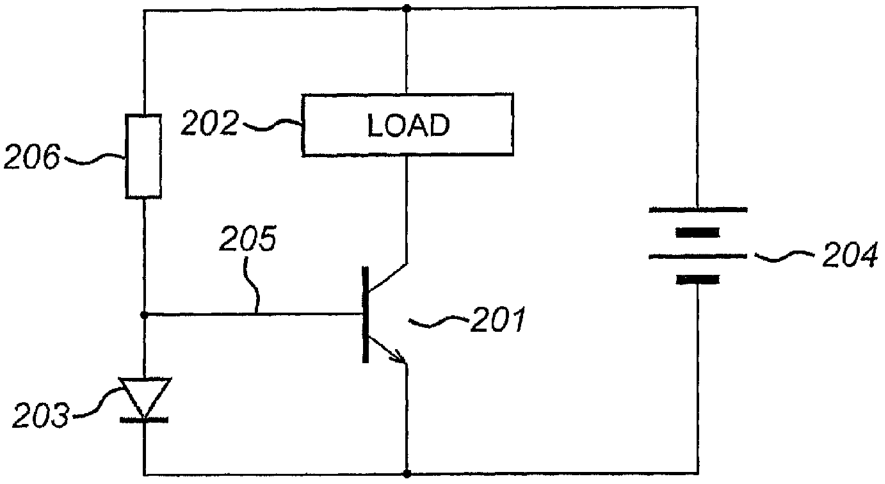

FIG. 3 -- Prior Art --
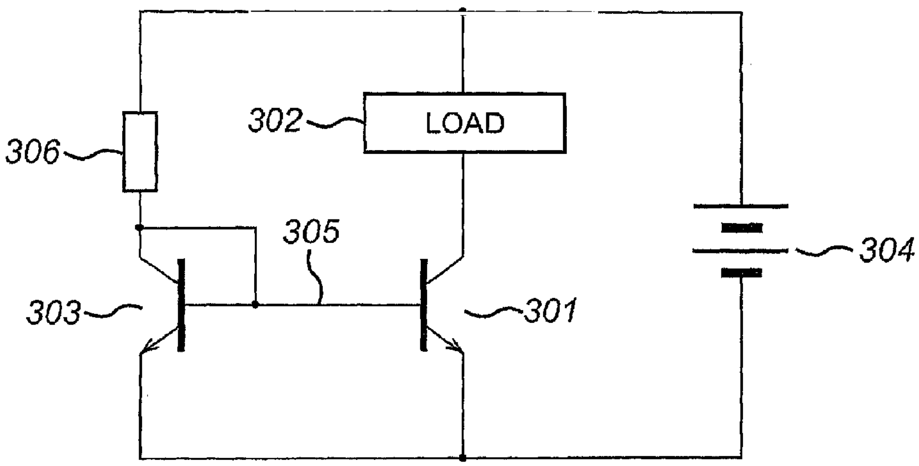
FIG. 4 -- Prior Art --
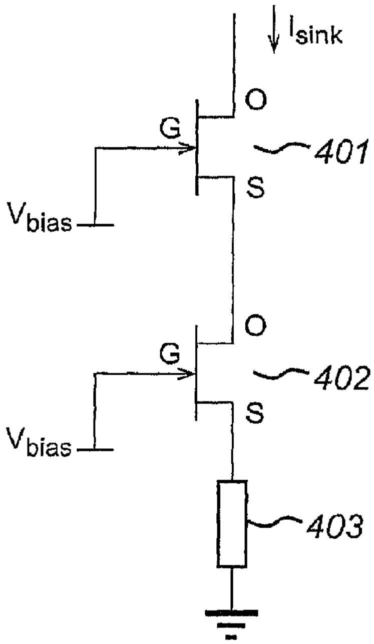
FIG. 5 -- Prior Art --
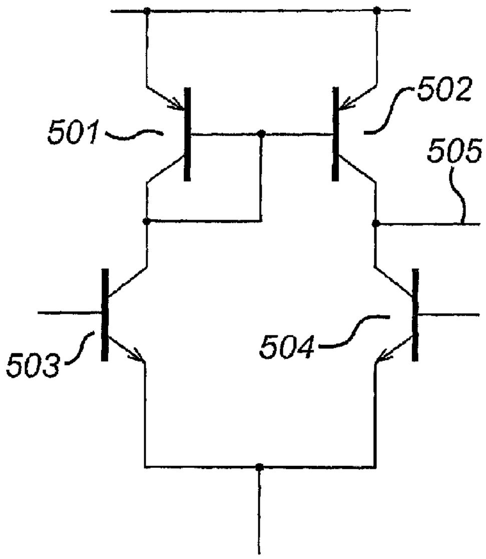

-- Prior Art --

-- Prior Art --

ADAPTIVE FEEDBACK CASCODE

BACKGROUND OF THE INVENTION

1. Field of the Invention

The invention relates to a current mirror for generating a substantially identical current flow in two parallel current paths. In particular, the invention relates to a current mirror having two transistors, in which it is desirable to keep the voltage across the active terminals of each respective transistor substantially the same as the voltage dropped across the active terminals of the other of the transistors.

2. Description of the Related Art

Transistors are charge-controlled devices that generally have three terminals: two active terminals and a control terminal. Conduction between the two active terminals depends on the availability of charge carriers, which is typically controlled by a voltage applied to the control terminal. There are two principal varieties of transistor: field-effect transistors (FETs) and bipolar junction transistors (BJTs). The operation of each type of transistor is slightly different. With FETs, the current that flows between the active terminals of the transistor is principally controlled by the voltage across its gate-source terminals. This can be achieved by applying a voltage to the transistor's control terminal (gate). The control terminal generally draws negligible current. With BJTs, the transistor generally needs to be forward-biased at its base-emitter junction for the collector-emitter diode to become conducting. This is typically achieved by applying a voltage to the transistor's control terminal (base). Thereafter, the current flowing between the active terminals (i.e. across the base-emitter function) is a multiple of the current flowing into the control terminal.

SUMMARY OF THE INVENTION

Transistors are often used as current generation devices. FIG. 1 shows a current generator formed using a BJT transistor. A current generator can be similarly formed using an FET transistor. The transistor 101 is connected between load 102 and power source 104. Provided that the transistor is correctly biased via its control input 105 the transistor will conduct current between its active terminals, i.e. it will permit current to flow around the circuit connecting the load to the power source. The current flowing between the active terminals of the transistor is determined by the bias voltage set by power supply 103. In the example shown, the transistor is a BJT and so the current that will flow between the active terminals of the transistor is also dependent on the current flowing between the control terminal and the active terminals of the transistor. Therefore, provided that the transistor is correctly biased, a constant current flows through load 102.

Maintaining a constant voltage across the transistor's base-emitter junction in FIG. 1 can be straightforwardly achieved using a diode connected between the transistor's base and emitter, as shown in FIG. 2. The diode 203 sets the bias voltage for the transistor's base-emitter junction. If the current through the diode is increased (e.g. by adjusting the resistance of resistor 206), then the voltage across the diode also increases, which increases the bias of the transistor's base-emitter junction. This in turn increases the current flowing through the transistor's collector-emitter junction. If the diode's PN junction and the transistor's base-emitter junction are well-matched, the current flowing through the transistor's emitter will closely equal the current flowing through the diode at any given time. For a typical BJT transistor, the collector current at any given time instant is roughly equal to the emitter current. Therefore, changing the value of resistor 206 will change both the diode current and the current flowing through the load. The current generated by the transistor "mirrors" that flowing through the diode.

In order to achieve the desired "mirror" effect, the PN junctions of the diode and the transistor should be as closely matched as possible. One way of achieving this is to use a second transistor to set the bias of the first transistor, as shown in FIG. 3. In this circuit, transistor 301 is biased in the same way as transistor 303 via its base connection 305. If the transistors are well-matched, their respective emitter and collector junctions should experience roughly the same current at any given time instant. Therefore, a constant current can be provided to load 302 through transistor 301, the value of the current being set by the resistance of resistor 306.

An ideal current source provides a constant output current irrespective of the load conditions. However, in practice no transistor has infinite output impedance and so variation of output current with output voltage will tend to be seen. One solution to this problem is to use a cascode. One example of a FET cascode is shown in FIG. 4. FIG. 4 illustrates a current sink provided by transistor 402, which "pulls" a constant current towards ground. The sink current is dependent on the bias applied across the gate-source terminals of the transistor by means of bias resistor 403. However, the sink current is also affected by the voltage drop across the drain-source terminals. As transistor 402 is connected to ground, this means that the sink current varies in dependence on the voltage seen by transistor 402 at its drain terminal. In the circuit shown in FIG. 4, this voltage is kept constant by a further transistor 401. This transistor is selected to have a larger maximum current capability than transistor 402, so that it can accommodate whatever sink current transistor 402 is pulling to ground. Transistor 401 passes the constant sink current set by transistor 402 down to the drain terminal of transistor 402. The gate-source voltage of transistor 401 therefore has to be sufficient for the drain-source junction of transistor 401 to conduct this current. The gate-source voltage required effectively sets the voltage level at the drain terminal of transistor 402. Transistor 402 therefore experiences a constant drain-source voltage and can continue to sink a constant current, irrespective of any load connected to transistor 401.

A cascode arrangement can be beneficially incorporated into a current mirror, such as the one shown in FIG. 3, to assist the voltages across the active terminals of the transistors to remain at a constant level despite different loading situations.

One advantageous use of current mirrors is to increase the gain of a differential amplifier. Such an amplifier is illustrated in FIG. 5. In FIG. 5, the BJT transistors 503 and 504 make up the differential amplifier. The base of one transistor will form the inverting input to the amplifier while the base of the other transistor will form the non-inverting input to the amplifier. Often, a constant current source may be provided at the common electrodes of the amplifier transistors, forming a so-called "long-tailed pair" amplifier. In FIG. 5, transistors 501 and 502 make up the current mirror. The current mirror acts as the collector load for the amplifier input transistors and provide a high effective collector load resistance, which increases the gain of the amplifier.

A folded MOSFET version of the circuit in FIG. 5 is the differential amplifier shown in FIG. 6. The core of this circuit is the differential amplifier shown generally at 601, which incorporates transistors 603, 604 and 605. The drain terminals of each of the amplifier input transistors 603, 604 are connected to a current mirror shown generally at 602. The current mirror is provided by transistors 606, 607 and bias transistors 608, 609. The output of the circuit is provided at output node 610.

A disadvantage of the circuit shown in FIG. 6 is that when an external load is connected to the output node this can cause voltage variations at the drain terminal of transistor 606. The result is that the drain-source voltage across transistor 606 differs from that across transistor 607 in dependence on the load, causing a different current to be generated by each of the two current paths. This discrepancy causes distortion in the output of the differential amplifier.

As an example, the differential amplifier shown in FIG. 6 can be suitably used in the feedback path of a linear regulator. A typical circuit for a linear regulator is shown in FIG. 7. The linear regulator operates to generate a constant output voltage at node 705 from an unregulated input voltage provided at node 704. This voltage regulation is achieved by means of a feedback loop that compares a fraction of the output voltage with a reference voltage 701 by means of a differential amplifier 702. The output of the differential amplifier is provided to a pass transistor 703 which separates the amplifier from a load connected to the output voltage. The output from the differential amplifier is input to the control terminal of the pass transistor, thus controlling the current which flows between the active terminals of the pass transistor. The output voltage of the linear regulator is set by the reference voltage 701 and resistors 706 and 707 which form a potential divider so that a fraction of the output voltage can be compared with the reference voltage.

A problem with implementing the circuit shown in FIG. 7 with a differential amplifier as shown in FIG. 6 is that the voltage at the control terminal of the pass transistor tends to vary with the load current of the regulator. The drain-source voltage across the diode-connected transistor 607 is determined by the bias current and the dimensioning of the transistor itself. The drain-source voltage across mirror transistor 606 is determined by the output voltage seen an output node 610. Thus the variation in voltage witnessed at the control terminal of the pass transistor causes the drain-source voltage across mirror-transistor 606 to also vary. Any mismatch between the drain-source voltages of transistors 606, 607 introduces an offset. Because of the voltage variation introduced at the output node 610 by the loading of the linear regulator, this mismatch becomes load-current dependent which introduces distortion and worsens the load-regulation of the regulator.

Therefore, there is a need for an improved current mirror that can address the problem of load-dependent distortion in the currents generated by each of the two current paths.

According to a first embodiment of the invention, there is provided a current mirror for generating a substantially identical current flow in two parallel current paths, each current path comprising a switching device and each switching device comprising first and second active terminals and a control terminal for controlling current flow between the first and second active terminals, the current mirror comprising a first switching device arranged such that its first active terminal is arranged to receive a first voltage, its second active terminal is arranged to receive a variable voltage that varies independently of the first voltage and its control terminal is arranged to receive a control voltage, a second switching device connected such that its first active terminal is arranged to receive the first voltage and its control terminal is arranged to receive the control voltage and a voltage control device connected to the second switching device such that an input of the voltage control device is connected to the second active terminal of the second switching device, the voltage control device being arranged to receive a control signal indicative of the variable voltage and to alter the voltage at its input terminal in dependence on the control signal such that the difference between the voltage across the active terminals of the second switching device and the voltage across the active terminals of the first switching device remains substantially constant.

The voltage control device preferably comprises an output, the voltage control device preferably being arranged such that its output is arranged to receive a substantially constant voltage. The respective control terminals of the first and second switching devices may be arranged to receive the substantially constant voltage.

Preferably the voltage control device comprises an output and a control input for controlling current flow between its input and output, the control input being arranged to receive the control signal.

The second switching device may be arranged to, when its control input is connected to the substantially constant voltage, cause a substantially constant current to flow between its first and second active terminals, the voltage control device being arranged to permit said current to flow between its input and output by varying the voltage at its input in dependence on the control signal. The voltage control device is preferably arranged to vary the voltage at its input so as to maintain a voltage difference between the input and its control input sufficient to permit said current to flow.

The voltage control device may be a third switching device arranged such that its first active terminal is connected to the second active terminal of the second switching device, its second active terminal is arranged to receive the substantially constant voltage and its control terminal is arranged to receive the control signal and to control the current flow between the first and second active terminals in dependence on the control signal.

The current mirror may also comprise a control signal generation device for generating the control signal, the control signal generation device having a control input arranged to be connected to the variable voltage and an output connected to the control input of the voltage control device. Preferably the control signal generation device comprises an input arranged to receive the first voltage and preferably the control signal generation device is arranged to permit a current to flow between its input and output in dependence on the voltage at its control input.

The current mirror may comprise a current generator connected in series with the control signal generation device such that an input of the current generator is connected to the output of the control signal generation device, the current generator being arranged to generate a substantially constant current and the control signal generation device being arranged to permit said current to flow between its input and output by varying the voltage at its output in dependence on the variable voltage.

The control signal generation device is preferably arranged to vary the voltage at its output so as to maintain a voltage difference between its output and its control input sufficient to permit the current generated by the current generation device to flow between its input and output.

The current mirror may comprise a fourth switching device arranged such that its second active terminal is arranged to receive the first voltage, its first active terminal is arranged to output the control signal to the voltage control device and its control terminal is arranged to receive the variable voltage.

Each of the switching devices is preferably a transistor, and may be a field effect transistor.

The voltage control device may be arranged to alter the voltage at its input terminal such that at any given time instant the voltage across the active terminals of the second switching device is substantially identical to the voltage across the active terminals of the first switching device.

According to a second embodiment of the invention, there is provided an amplifier comprising a current mirror for generating a substantially identical current flow in two parallel current paths, each current path comprising a switching device and each switching device comprising first and second active terminals and a control terminal for controlling current flow between the first and second active terminals, the current mirror comprising a first switching device arranged such that its first active terminal is arranged to receive a first voltage, its second active terminal is arranged to receive a variable voltage that varies independently of the first voltage and its control terminal is arranged to receive a control voltage, a second switching device connected such that its first active terminal is arranged to receive the first voltage and its control terminal is arranged to receive the control voltage and a voltage control device connected to the second switching device such that an input of the voltage control device is connected to the second active terminal of the second switching device, the voltage control device being arranged to receive a control signal indicative of the variable voltage and to alter the voltage at its input terminal in dependence on the control signal such that the difference between the voltage across the active terminals of the second switching device and the voltage across the active terminals of the first switching device remains substantially constant.

The amplifier preferably comprises circuitry arranged to generate the variable voltage.

The amplifier may form part of a linear regulator such that the second active terminal of the first switching device is connected to the control input of a pass switching device.

BRIEF DESCRIPTION OF THE DRAWINGS

The invention will now be described by way of example, with reference to the accompanying drawings in which:

FIG. 1 shows a typical constant current source;

FIG. 2 shows a current mirror in which biasing is provided by a diode;

FIG. 3 shows a current mirror in which biasing is provided by means of a diode-connected transistor;

FIG. 4 shows a cascoded current source;

FIG. 5 shows a differential amplifier incorporating a current mirror;

DETAILED DESCRIPTION OF EMBODIMENTS OF THE INVENTION

Embodiments of the invention address the problems described above by implementing a current mirror in which a voltage control device is connected to an active terminal of the diode connected transistor. The voltage control device is arranged to receive a control signal and to vary the voltage at one of its nodes in dependence on that control signal. The node of the voltage control device at which this variable voltage is created is connected to one of the active terminals of that mirror transistor so that it experiences the same voltage variation to which the other mirror transistor is subject. In this way, the difference between the voltages across the respective active terminals of the mirror transistors can be kept substantially constant. In other words, the same voltage variation is seen across the active terminals of each of mirror transistor.

Figure 8:
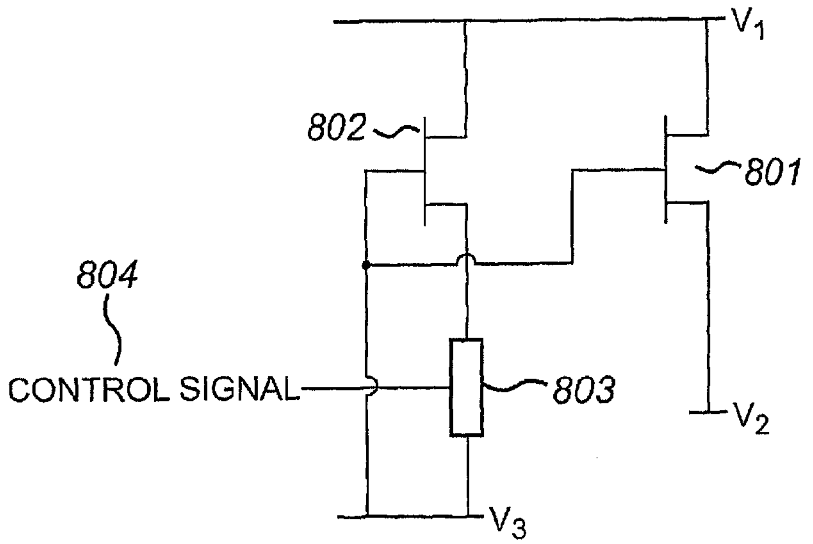
FIG. 8 shows a current mirror according to an embodiment of the invention.

FIG. 8 shows a current mirror according to an embodiment of the invention. In this embodiment the mirror transistors 801, 802 both have an active terminal connected to a first voltage $V_1$. The second active terminal of the first transistor 801 is connected to a second voltage $V_2$. The second active terminal of the second transistor 802 is connected to an input of a voltage control device 803. The voltage control device also receives a control signal 804 at a control input. The voltage control device is arranged to alter the voltage at its input (the terminal connected to transistor 802) in dependence on the control signal, which enables it to vary the voltage across the active terminals of transistor 802 such that the difference between that voltage and the voltage across the active terminals of transistor 801 remains substantially constant.

FIG. 8 illustrates an embodiment of the invention using FET transistors. It should be understood that this is for the purposes of example only and that the invention could also be advantageously implemented in a current mirror utilising BJT transistors.

The current mirror according to preferred embodiments of the invention is advantageous because it improves linearity. It also enables any mismatch across the active terminals of the mirror transistors in a current mirror to be made largely independent of any output voltage of the circuit. By maintaining the difference in voltage across the active terminals of the mirror transistors to be substantially constant, despite any voltage variations to which one of the transistors may be subjected, any current mismatch between the two current paths of the mirror can be kept independent of the loading by an output circuit so that load-dependent distortion can be effectively reduced or even eliminated.

According to one embodiment of the invention, the voltages across the respective active terminals of the mirror transistors may be kept substantially identical, i.e. so that at any given time instant the voltage across the active terminals of transistor 802 in FIG. 8 will be substantially identical to the voltage across the active terminals of transistor 801. Keeping the voltages identical has the additional advantage of reducing systematic offset.

Specific examples of current mirrors according to embodiments of the invention will now be described. It should be understood that this is for the purposes of example only and that the invention is intended to encompass any current mirror incorporating a voltage control device for varying the voltage across the active terminals of one switching device so that it sees the same variation as the voltage across the active terminals of another switching device.

The voltage control unit may suitably be implemented by a device that conducts current in dependence on the voltage at the input to which the second transistor 802 is connected. Preferably, the current flow is dependent on a voltage difference between the control input of the voltage control device and the input to which the second transistor is connected. In this way, if the voltage control device is obliged to conduct a constant current generated by transistor 802 between its input and output terminals, the voltage control device will be obliged to change the voltage at its input responsive to the varying control signal at its control input in order to maintain the necessary voltage difference between its control and input terminals to permit the constant current to flow. The voltage control device may therefore be suitably implemented by a transistor (as explained in a specific example below).

The control signal 804 that is received by the voltage control device may simply be the variable voltage (e.g. $V_2$) to which transistor 801 is being subjected. Alternatively, a control signal generation device may be provided for generating the control signal.

A specific implementation of the current mirror according to embodiments of the invention will now be described with reference to a specific implementation in which the current mirror is incorporated in a differential amplifier. This is for the purposes of example only and it should be understood that the current mirror according to embodiments of the invention is not limited to any specific application but can be advantageously used in many different applications.

Figure 9:
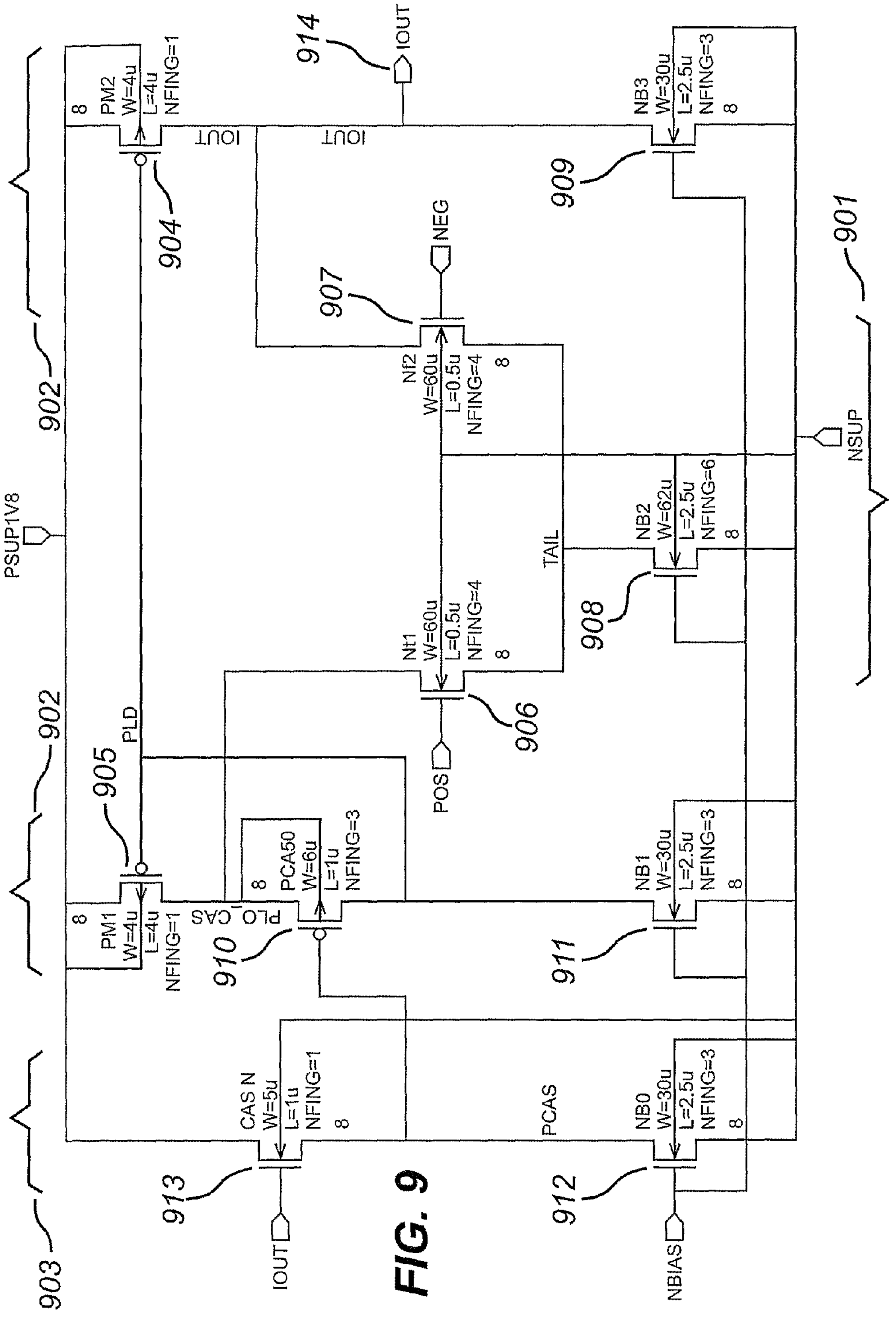
FIG. 9 shows a differential amplifier incorporating a current mirror according to embodiments of the invention.

A differential amplifier according to a specific embodiment of the invention is shown in FIG. 9. FIG. 9 shows a differential amplifier 901, as before, a current mirror 902 and a control signal generation device 903. The current mirror 902 is similar to that shown in FIG. 6 but it incorporates an extra transistor 910. Transistor 910 is connected in series with mirror transistor 905. Transistor 910 provides the voltage control device in this implementation and it is operable to alter voltage PLD_CAS at the drain of the mirror transistor 905 in response to the control signal PCAS at its gate. The gates of both mirror transistors 904, 905 are connected to the drain of transistor 910 so that the voltage at the gates of the mirror transistors is set by the dimensioning of transistor 905 and by the current set by bias transistors 911 and 908. Transistor 910 acts in a similar way to the cascode transistor shown in FIG. 4 by passing the substantially constant current between its drain and source. However, in the case of transistor 910 the voltage applied to its gate is not constant. Instead, the voltage at the transistor's gate is provided by PCAS, which varies in voltage in dependence on the voltage at output node 914. Therefore, in order to maintain its gate-source voltage at the level required to pass the constant current being generated by bias transistor 911, transistor 910 is obliged to alter the voltage level at its source terminal as the control signal at its gate input varies in voltage. In this way, the transistor 910 keeps the voltage variation across the drain-source junction of the mirror transistor 905 substantially the same as the voltage variation across the drain-source junction of mirror transistor 904.

The control signal generation device 903 in FIG. 9 is operable to generate an appropriate control signal for the gate of the voltage control transistor 910. In FIG. 9, this function is performed by transistor 913 in combination with transistor 912. Transistor 912 provides a constant current source so that the control signal generation device is provided by a cascode arrangement. The cascode voltage PCAS, which provides the control signal to the gate of control transistor 910, is generated by transistor 913 as it is obliged to alter its source voltage to keep its gate-source voltage at the constant value required to pass the constant current being generated by transistor 912.

Preferably the parameters of the transistors used for the voltage control device and the control signal generation device should be chosen so that the voltage PLD_CAS is substantially identical to the voltage at output node 914 at any given time instant. The voltage supplied to the gates of mirror transistors 904, 905 should preferably be kept constant.

Figure 6:
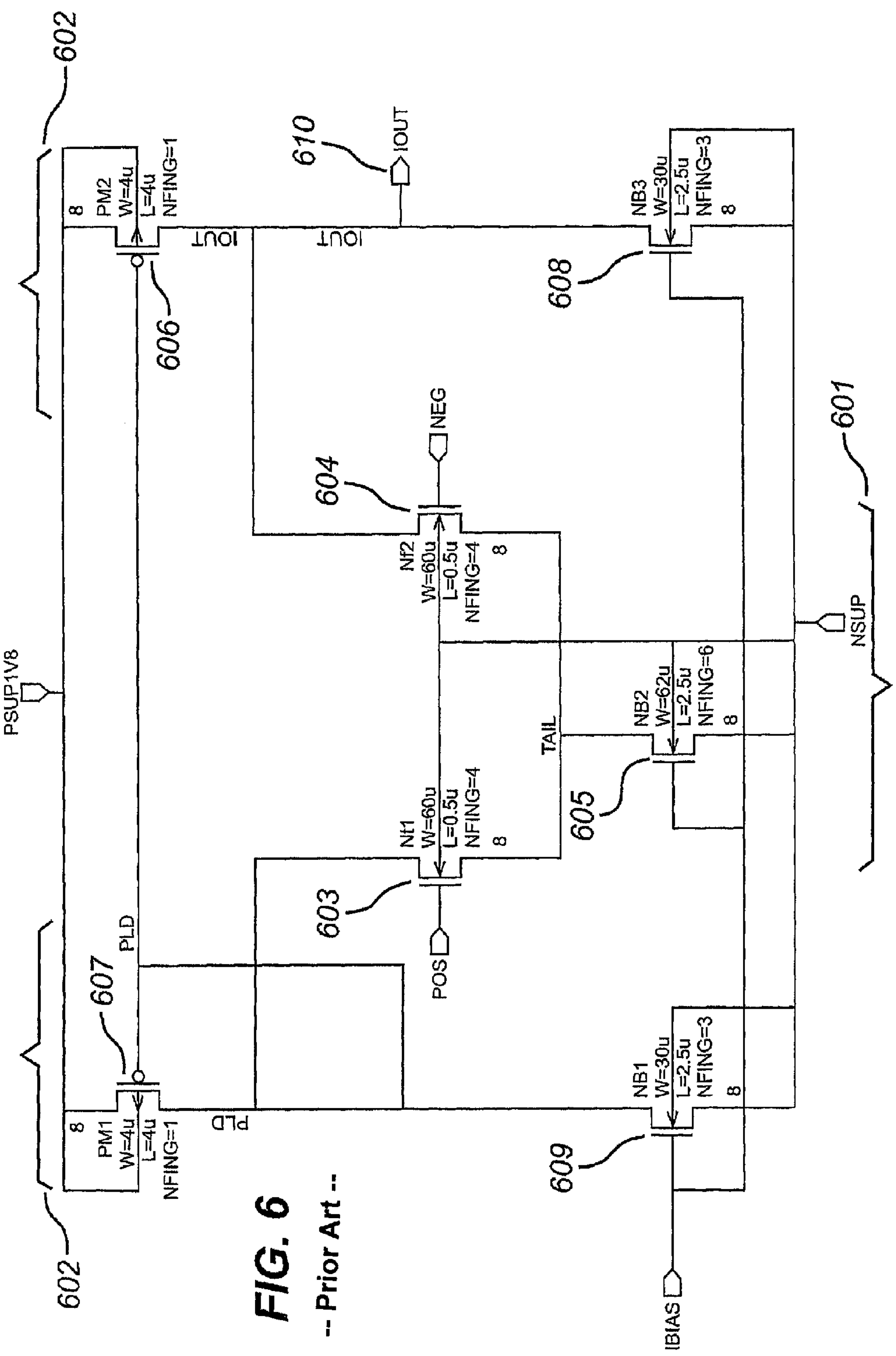
FIG. 6 shows a long-tailed differential amplifier incorporating a folded current mirror.
Figure 7:
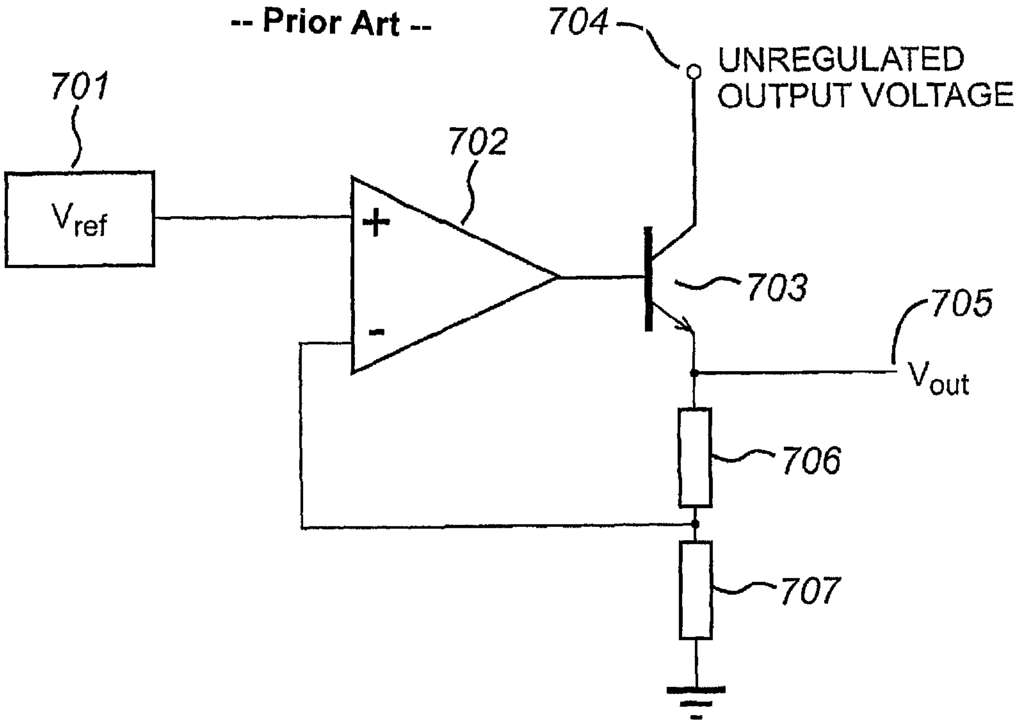
FIG. 7 shows a linear regulator incorporating a differential amplifier in its feedback loop.
Figure 10:
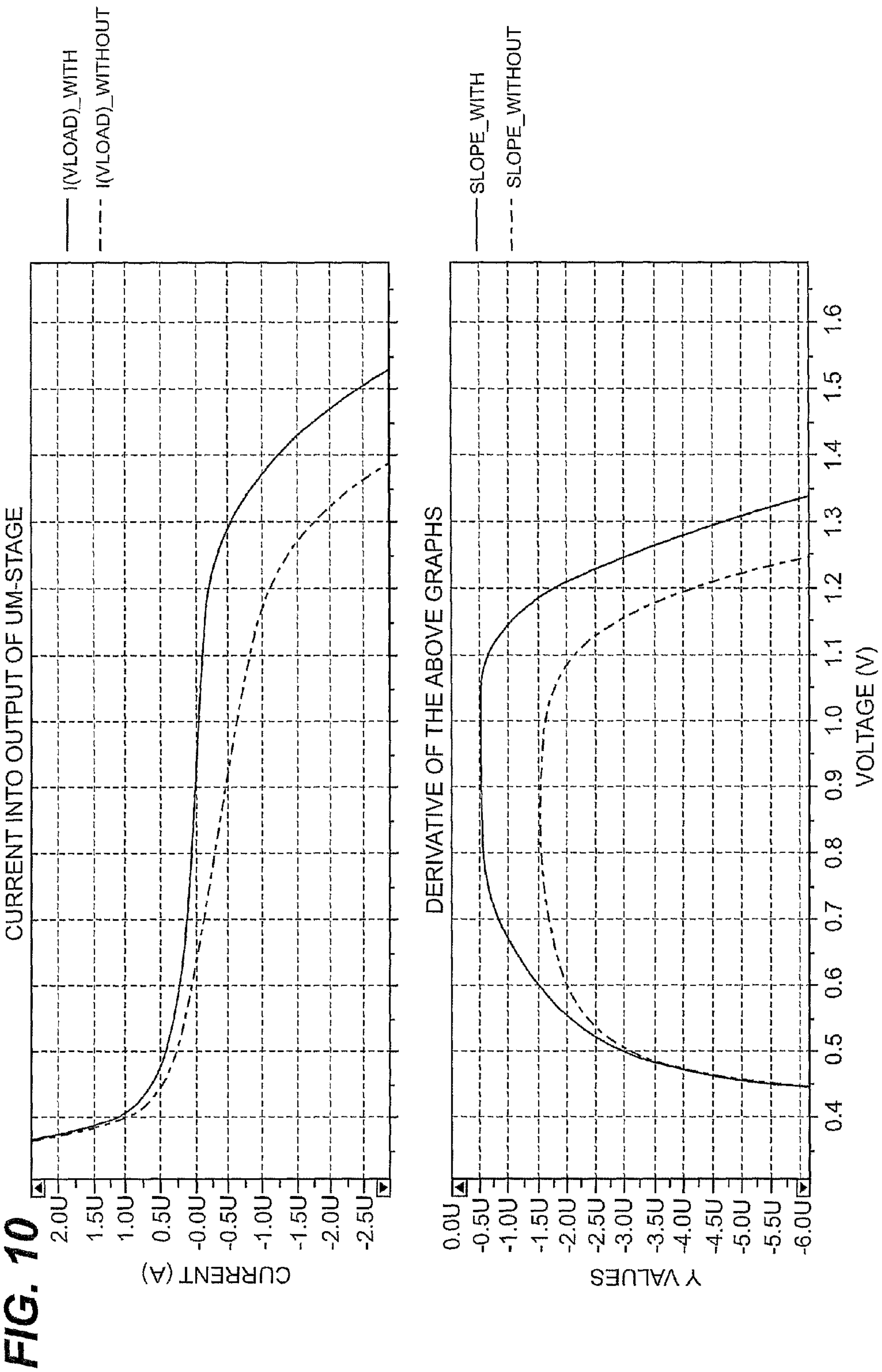
FIG. 10 shows simulation results comparing a circuit having an adaptive feedback cascode according to embodiments of the invention with a circuit without the adaptive feedback cascode.

The simulation results in FIG. 10 show that the circuit shown in FIG. 9 has much reduced output voltage dependence compared with the circuit shown in FIG. 6.

The circuit shown in FIG. 9 is advantageous because the voltage mismatch across the active terminals of the mirror-transistors has been made largely independent of output voltage. If this circuit were used in the feedback loop of a linear regulator, the mismatch would become independent of the regulator load current, thus improving the load regulation.

If a current mirror is used without the adaptive feedback cascode shown in FIG. 9, then the pass device of a linear regulator needs to be made very large in order to keep the drain-source voltage variation across the mirror transistors relatively small over all possible load currents so that the load-regulation requirements can be met. Employing the adaptive feedback cascode according to embodiments of the invention greatly improves load regulation. Alternatively, for a given load-regulation requirement the maximum load current through a given pass device can be increased. A further option is that for a given maximum load current, the size of the pass device can be reduced.

In other applications, the adaptive feedback cascode according to embodiments of the invention may be used to reduce the distortion introduced by any signal-dependent variation of voltage mismatch across the active terminals of the mirror transistors of a conventional current mirror.

The adaptive feedback cascode is preferably implemented using MOSFET transistors. However, JFET or BJT transistors could also be used. The cascode can also be implemented using both n-mos and p-mos input stages. The same principles apply as in the circuit shown in FIG. 9, but the device types are inverted and the structure is "upside-down".

The applicant hereby discloses in isolation each individual feature described herein and any combination of two or more such features, to the extent that such features or combinations are capable of being carried out based on the present specification as a whole in light of the common general knowledge of a person skilled in the art, irrespective of whether such features or combinations of features solve any problems disclosed herein, and without limitation to the scope of the claims. The applicant indicates that aspects of the present invention may consist of any such feature or combination of features. In view of the foregoing description it will be evident to a person skilled in the art that various modifications may be made within the scope of the invention.

The invention claimed is:

1. A current mirror for generating a substantially identical current flow in two parallel current paths, each current path comprising a switching device and each switching device comprising first and second active terminals and a control terminal for controlling current flow between the first and second active terminals, the current mirror comprising:

a first switching device arranged such that its first active terminal is arranged to receive a first voltage, its second active terminal is arranged to receive a variable voltage that varies independently of the first voltage and its control terminal is arranged to receive a control voltage;

a second switching device connected such that its first active terminal is arranged to receive the first voltage and its control terminal is arranged to receive the control voltage;

a voltage control device connected to the second switching device such that an input of the voltage control device is connected to the second active terminal of the second switching device, the voltage control device being arranged to receive a control signal indicative of the variable voltage and to alter the voltage at its input terminal in dependence on the control signal such that the difference between the voltage across the active terminals of the second switching device and the voltage across the active terminals of the first switching device remains substantially constant, and a control signal generation device comprising a third switching device arranged such that its second active terminal is arranged to receive the first voltage, its first active terminal is arranged to output the control signal to the voltage control device and its control terminal is arranged to receive the variable voltage, wherein the third switching device is a transistor.

2. A current mirror as claimed in claim 1, wherein the voltage control device comprises an output, the voltage control device being arranged such that its output is arranged to receive a substantially constant voltage.

3. A current mirror as claimed in claim 2, wherein the respective control terminals of the first and second switching devices are arranged to receive the substantially constant voltage.

4. A current mirror as claimed in claim 1, wherein the voltage control device comprises an output and a control input for controlling current flow between its input and output, the control input being arranged to receive the control signal.

5. A current mirror as claimed in claim 3, wherein the voltage control device comprises an output and a control input for controlling current flow between its input and output, the control input being arranged to receive the control signal, the second switching device is arranged to, when its control input is connected to the substantially constant voltage, cause a substantially constant current to flow between its first and second active terminals, the voltage control device being arranged to permit said current to flow between its input and output by varying the voltage at its input in dependence on the control signal.

6. A current mirror as claimed in claim 5, wherein the voltage control device is arranged to vary the voltage at its input so as to maintain a voltage difference between the input and its control input sufficient to permit said current to flow.

7. A current mirror as claimed in claim 2, wherein the voltage control device is a fourth switching device arranged such that its first active terminal is connected to the second active terminal of the second switching device, its second active terminal is arranged to receive the substantially constant voltage and its control terminal is arranged to receive the control signal and to control the current flow between the first and second active terminals in dependence on the control signal.

8. A current mirror as claimed in claim 1, wherein the control signal generation device is arranged to permit a current to flow between its input and output in dependence on the voltage at its control input.

9. A current mirror as claimed in claim 8, wherein the current mirror comprises a current generator connected in series with the control signal generation device such that an input of the current generator is connected to the output of the control signal generation device, the current generator being arranged to generate a substantially constant current and the control signal generation device being arranged to permit said current to flow between its input and output by varying the voltage at its output in dependence on the variable voltage.

10. A current mirror as claimed in claim 9, wherein the control signal generation device is arranged to vary the voltage at its output so as to maintain a voltage difference between its output and its control input sufficient to permit the current generated by the current generation device to flow between its input and output.

11. A current mirror as claimed in claim 1, wherein each of the switching devices is a transistor.

12. A current mirror as claimed in claim 1, wherein each of the switching devices is a field effect transistor.

13. A current mirror as claimed in claim 1, wherein the voltage control device is arranged to alter the voltage at its input terminal such that at any given time instant the voltage across the active terminals of the second switching device is substantially identical to the voltage across the active terminals of the first switching device.

14. An amplifier comprising a current mirror for generating a substantially identical current flow in two parallel current paths, each current path comprising a switching device and each switching device comprising first and second active terminals and a control terminal for controlling current flow between the first and second active terminals, the current mirror comprising:

a first switching device arranged such that its first active terminal is arranged to receive a first voltage, its second active terminal is arranged to receive a variable voltage that varies independently of the first voltage and its control terminal is arranged to receive a control voltage;

a second switching device connected such that its first active terminal is arranged to receive the first voltage and its control terminal is arranged to receive the control voltage;

a voltage control device connected to the second switching device such that an input of the voltage control device is connected to the second active terminal of the second switching device, the voltage control device being arranged to receive a control signal indicative of the variable voltage and to alter the voltage at its input terminal in dependence on the control signal such that the difference between the voltage across the active terminals of the second switching device and the voltage across the active terminals of the first switching device remains substantially constant; and a control signal generation device comprising a third switching device arranged such that its second active terminal is arranged to receive the first voltage, its first active terminal is arranged to output the control signal to the voltage control device and its control terminal is arranged to receive the variable voltage; wherein the third switching device is a transistor.

15. An amplifier as claimed in claim 14, wherein the amplifier comprises circuitry arranged to generate the variable voltage.

16. An amplifier as claimed in claim 14, wherein the amplifier forms part of a linear regulator such that the second active terminal of the first switching device is connected to the control input of a pass switching device.

* * * * *